(12) United States Patent
Kosowsky et al.

(10) Patent No.: US 8,399,773 B2
(45) Date of Patent: Mar. 19, 2013

(54) SUBSTRATES HAVING VOLTAGE SWITCHABLE DIELECTRIC MATERIALS

(75) Inventors: Lex Kosowsky, San Jose, CA (US);
Bhret Graydon, San Jose, CA (US);
Djabbar Moustafaev, Aptos, CA (US);
Shurui Shang, San Jose, CA (US);
Robert Fleming, San Jose, CA (US)

(73) Assignee: Shocking Technologies, Inc., San Jose, CA (US)

( * ) Notice: Subject to any disclaimer, the term of this patent is extended or adjusted under 35 U.S.C. 154(b) by 319 days.

(21) Appl. No.: 12/694,702

(22) Filed: Jan. 27, 2010

(65) Prior Publication Data
US 2010/0187006 A1    Jul. 29, 2010

Related U.S. Application Data

(60) Provisional application No. 61/147,730, filed on Jan. 27, 2009.

(51) Int. Cl.
*H05K 9/00* (2006.01)
*G06F 17/50* (2006.01)
*B05D 5/12* (2006.01)
*H05K 1/11* (2006.01)

(52) U.S. Cl. ........ 174/250; 174/255; 174/256; 361/748; 361/750; 361/762; 361/795; 428/209; 428/212

(58) Field of Classification Search .......... 174/250–267, 174/350; 361/760–767, 777–782, 792, 794–795, 361/824; 29/825–852; 257/687, 782, 668, 257/678, 700–703, 734, 758, 737, 738, 698, 257/690–693, 530, 779; 438/700, 99, 106–118, 438/623; 428/212, 322, 137, 209, 446, 114, 428/412, 416, 3, 299.1, 489, 697, 297.4, 428/210
See application file for complete search history.

(56) References Cited

U.S. PATENT DOCUMENTS

| | | | |
|---|---|---|---|
| 3,347,724 A | 10/1967 | Schneble, Jr. et al. |
| 3,685,026 A | 8/1972 | Wakabayashi et al. |
| 3,685,028 A | 8/1972 | Wakabayashi et al. |
| 3,723,635 A | 3/1973 | Smith |
| 3,808,576 A | 4/1974 | Castonguay et al. |
| 3,926,916 A | 12/1975 | Mastrangelo |
| 3,977,957 A | 8/1976 | Kosowsky et al. |
| 4,113,899 A | 9/1978 | Henry et al. |
| 4,133,735 A | 1/1979 | Afromowitz et al. |

(Continued)

FOREIGN PATENT DOCUMENTS

| DE | 3040784 A1 | 5/1982 |
|---|---|---|
| DE | 10115333 A1 | 1/2002 |

(Continued)

OTHER PUBLICATIONS

U.S. Appl. No. 12/714,354, Kosowsky, filed Feb. 26, 2010.

(Continued)

*Primary Examiner* — Michail V Datskovskiy
(74) *Attorney, Agent, or Firm* — Mahamedi Paradice Kreisman LLP

(57) ABSTRACT

Various aspects provide for incorporating a VSDM into a substrate to create an ESD-protected substrate. In some cases, a VSDM is incorporated in a manner that results in the ESD-protected substrate meeting one or more specifications (e.g., thickness, planarity, and the like) for various subsequent processes or applications. Various aspects provide for designing a substrate (e.g., a PCB) incorporating a VSDM, and adjusting one or more aspects of the substrate to design a balanced, ESD-protected substrate. Certain embodiments include molding a substrate having a VSDM layer into a first shape.

25 Claims, 8 Drawing Sheets

U.S. PATENT DOCUMENTS

| | | | |
|---|---|---|---|
| 4,252,692 A | 2/1981 | Taylor et al. | |
| 4,269,672 A | 5/1981 | Inoue | |
| 4,331,948 A | 5/1982 | Malinaric et al. | |
| 4,359,414 A | 11/1982 | Mastrangelo | |
| 4,405,432 A | 9/1983 | Kosowsky | |
| 4,439,809 A | 3/1984 | Weight et al. | |
| 4,506,285 A | 3/1985 | Einzinger et al. | |
| 4,591,411 A | 5/1986 | Reimann | |
| 4,642,160 A | 2/1987 | Burgess | |
| 4,702,860 A | 10/1987 | Kinderov et al. | |
| 4,714,952 A | 12/1987 | Takekawa et al. | |
| 4,726,877 A | 2/1988 | Fryd et al. | |
| 4,726,991 A | 2/1988 | Hyatt et al. | |
| 4,732,636 A * | 3/1988 | Varker | 156/252 |
| 4,799,128 A | 1/1989 | Chen | |
| 4,888,574 A | 12/1989 | Rice et al. | |
| 4,892,776 A | 1/1990 | Rice | |
| 4,918,033 A | 4/1990 | Bartha et al. | |
| 4,928,199 A | 5/1990 | Diaz et al. | |
| 4,935,584 A | 6/1990 | Boggs | |
| 4,977,357 A | 12/1990 | Shrier | |
| 4,992,333 A | 2/1991 | Hyatt | |
| 4,996,945 A | 3/1991 | Dix, Jr. | |
| 5,068,634 A | 11/1991 | Shrier | |
| 5,092,032 A | 3/1992 | Murakami | |
| 5,095,626 A | 3/1992 | Kitamura et al. | |
| 5,099,380 A | 3/1992 | Childers et al. | |
| 5,142,263 A | 8/1992 | Childers et al. | |
| 5,148,355 A | 9/1992 | Lowe et al. | |
| 5,167,778 A | 12/1992 | Kaneko et al. | |
| 5,183,698 A | 2/1993 | Stephenson et al. | |
| 5,189,387 A | 2/1993 | Childers et al. | |
| 5,246,388 A | 9/1993 | Collins et al. | |
| 5,248,517 A | 9/1993 | Shrier et al. | |
| 5,252,195 A | 10/1993 | Kobayashi et al. | |
| 5,260,848 A | 11/1993 | Childers | |
| 5,262,754 A | 11/1993 | Collins | |
| 5,278,535 A | 1/1994 | Xu et al. | |
| 5,282,312 A | 2/1994 | DiStefano et al. | |
| 5,294,374 A | 3/1994 | Martinez et al. | |
| 5,295,297 A | 3/1994 | Kitamura et al. | |
| 5,300,208 A | 4/1994 | Angelopoulos et al. | |
| 5,317,801 A | 6/1994 | Tanaka et al. | |
| 5,340,641 A | 8/1994 | Xu | |
| 5,347,258 A | 9/1994 | Howard et al. | |
| 5,350,621 A * | 9/1994 | Yuhas et al. | 428/209 |
| 5,354,712 A | 10/1994 | Ho et al. | |
| 5,367,764 A | 11/1994 | DiStefano et al. | |
| 5,378,858 A | 1/1995 | Bruckner et al. | |
| 5,380,679 A | 1/1995 | Kano | |
| 5,393,597 A | 2/1995 | Childers et al. | |
| 5,403,208 A | 4/1995 | Felcman et al. | |
| 5,404,637 A | 4/1995 | Kawakami | |
| 5,413,694 A | 5/1995 | Dixon et al. | |
| 5,416,662 A | 5/1995 | Kurasawa et al. | |
| 5,440,075 A | 8/1995 | Kawakita et al. | |
| 5,444,593 A | 8/1995 | Allina | |
| 5,464,658 A * | 11/1995 | Yuhas et al. | 427/385.5 |
| 5,476,471 A | 12/1995 | Shifrin et al. | |
| 5,481,795 A | 1/1996 | Hatakeyama et al. | |
| 5,483,407 A | 1/1996 | Anastasio et al. | |
| 5,487,218 A | 1/1996 | Bhatt et al. | |
| 5,493,146 A | 2/1996 | Pramanik et al. | |
| 5,501,350 A | 3/1996 | Yoshida et al. | |
| 5,502,889 A | 4/1996 | Casson et al. | |
| 5,510,629 A | 4/1996 | Karpovich et al. | |
| 5,550,400 A | 8/1996 | Takagi et al. | |
| 5,557,136 A | 9/1996 | Gordon et al. | |
| 5,571,608 A * | 11/1996 | Swamy | 428/137 |
| 5,654,564 A | 8/1997 | Mohsen | |
| 5,669,381 A | 9/1997 | Hyatt | |
| 5,685,070 A | 11/1997 | Alpaugh et al. | |
| 5,708,298 A | 1/1998 | Masayuki et al. | |
| 5,714,794 A | 2/1998 | Tsuyama et al. | |
| 5,734,188 A | 3/1998 | Murata et al. | |
| 5,744,759 A | 4/1998 | Ameen et al. | |
| 5,781,395 A | 7/1998 | Hyatt | |
| 5,802,714 A | 9/1998 | Kobayashi et al. | |
| 5,807,509 A * | 9/1998 | Shrier et al. | 252/512 |
| 5,808,351 A | 9/1998 | Nathan et al. | |
| 5,834,160 A | 11/1998 | Ferry et al. | |
| 5,834,824 A | 11/1998 | Shepherd et al. | |
| 5,834,893 A | 11/1998 | Bulovic et al. | |
| 5,848,467 A | 12/1998 | Khandros et al. | |
| 5,856,910 A | 1/1999 | Yurchenko et al. | |
| 5,865,934 A | 2/1999 | Yamamoto et al. | |
| 5,869,869 A | 2/1999 | Hively | |
| 5,874,902 A | 2/1999 | Heinrich et al. | |
| 5,888,630 A * | 3/1999 | Sylvester et al. | 428/212 |
| 5,906,042 A | 5/1999 | Lan et al. | |
| 5,910,685 A | 6/1999 | Watanabe et al. | |
| 5,926,951 A | 7/1999 | Khandros et al. | |
| 5,940,683 A | 8/1999 | Holm et al. | |
| 5,946,555 A | 8/1999 | Crumly et al. | |
| 5,955,762 A | 9/1999 | Hively | |
| 5,956,612 A | 9/1999 | Elliott et al. | |
| 5,962,815 A | 10/1999 | Lan et al. | |
| 5,970,321 A | 10/1999 | Hively | |
| 5,972,192 A | 10/1999 | Dubin et al. | |
| 5,977,489 A | 11/1999 | Crotzer et al. | |
| 6,013,358 A | 1/2000 | Winnett et al. | |
| 6,023,028 B2 | 2/2000 | Neuhalfen | |
| 6,064,094 A | 5/2000 | Intrater et al. | |
| 6,108,184 B2 | 8/2000 | Minervini et al. | |
| 6,114,672 A | 9/2000 | Iwasaki | |
| 6,130,459 A | 10/2000 | Intrater | |
| 6,160,695 B2 | 12/2000 | Winnett et al. | |
| 6,172,590 B1 | 1/2001 | Shrier et al. | |
| 6,180,241 B1 * | 1/2001 | Suhir | 428/418 |
| 6,184,280 B1 | 2/2001 | Shibuta | |
| 6,191,928 B1 | 2/2001 | Rector et al. | |
| 6,198,392 B1 | 3/2001 | Hahn et al. | |
| 6,211,554 B1 | 4/2001 | Whitney et al. | |
| 6,239,687 B1 | 5/2001 | Shrier et al. | |
| 6,251,513 B1 | 6/2001 | Rector et al. | |
| 6,310,752 B1 | 10/2001 | Shrier et al. | |
| 6,316,734 B1 | 11/2001 | Yang | |
| 6,340,789 B1 | 1/2002 | Petritsch et al. | |
| 6,351,011 B1 | 2/2002 | Whitney et al. | |
| 6,373,719 B1 | 4/2002 | Behling et al. | |
| 6,407,411 B1 | 6/2002 | Wojnarowski | |
| 6,433,394 B1 | 8/2002 | Intrater | |
| 6,448,900 B1 | 9/2002 | Chen | |
| 6,455,916 B1 | 9/2002 | Robinson | |
| 6,468,593 B1 | 10/2002 | Iazawa | |
| 6,512,458 B1 | 1/2003 | Kobayashi et al. | |
| 6,534,422 B1 | 3/2003 | Ichikawa et al. | |
| 6,542,065 B2 | 4/2003 | Shrier et al. | |
| 6,549,114 B2 | 4/2003 | Whitney et al. | |
| 6,570,765 B2 | 5/2003 | Behling et al. | |
| 6,593,597 B2 | 7/2003 | Sheu | |
| 6,621,172 B2 | 9/2003 | Nakayama | |
| 6,628,498 B2 | 9/2003 | Whitney et al. | |
| 6,642,297 B1 | 11/2003 | Hyatt et al. | |
| 6,657,532 B1 * | 12/2003 | Shrier et al. | 338/21 |
| 6,677,183 B2 | 1/2004 | Sakaguchi et al. | |
| 6,693,508 B2 | 2/2004 | Whitney et al. | |
| 6,709,944 B1 | 3/2004 | Durocher et al. | |
| 6,741,217 B2 | 5/2004 | Toncich et al. | |
| 6,797,145 B2 * | 9/2004 | Kosowsky | 205/221 |
| 6,869,664 B2 * | 3/2005 | Vasoya et al. | 428/209 |
| 6,882,051 B2 | 4/2005 | Majumdar et al. | |
| 6,903,175 B2 | 6/2005 | Gore et al. | |
| 6,911,676 B2 | 6/2005 | Yoo | |
| 6,916,872 B2 | 7/2005 | Yadav et al. | |
| 6,981,319 B2 | 1/2006 | Shrier | |
| 7,034,652 B2 | 4/2006 | Whitney et al. | |
| 7,049,926 B2 * | 5/2006 | Shrier et al. | 338/21 |
| 7,053,468 B2 | 5/2006 | Lee | |
| 7,064,353 B2 | 6/2006 | Bhat | |
| 7,067,840 B2 | 6/2006 | Klauk | |
| 7,075,103 B2 * | 7/2006 | Yan et al. | 257/40 |
| 7,095,933 B2 * | 8/2006 | Barth | 385/129 |
| 7,132,697 B2 | 11/2006 | Weimer et al. | |
| 7,132,922 B2 | 11/2006 | Harris et al. | |
| 7,141,184 B2 | 11/2006 | Chacko et al. | |
| 7,173,288 B2 | 2/2007 | Lee et al. | |

| | | |
|---|---|---|
| 7,183,891 B2 | 2/2007 | Harris et al. |
| 7,202,770 B2* | 4/2007 | Harris et al. .................... 338/21 |
| 7,205,613 B2 | 4/2007 | Fjelstad et al. |
| 7,218,492 B2 | 5/2007 | Shrier |
| 7,253,504 B1* | 8/2007 | Zhai et al. ..................... 257/668 |
| 7,258,819 B2* | 8/2007 | Harris, IV ..................... 252/500 |
| 7,279,724 B2 | 10/2007 | Collins et al. |
| 7,320,762 B2 | 1/2008 | Greuter et al. |
| 7,341,824 B2 | 3/2008 | Sexton |
| 7,417,194 B2 | 8/2008 | Shrier |
| 7,446,030 B2 | 11/2008 | Kosowsky |
| 7,488,625 B2 | 2/2009 | Knall |
| 7,492,504 B2 | 2/2009 | Chopra et al. |
| 7,528,467 B2 | 5/2009 | Lee |
| 7,535,462 B2 | 5/2009 | Spath et al. |
| 7,567,416 B2* | 7/2009 | Kim et al. ..................... 361/126 |
| 7,585,434 B2 | 9/2009 | Morita |
| 7,593,203 B2 | 9/2009 | Dudnikov, Jr. et al. |
| 7,595,105 B2* | 9/2009 | Yan et al. ..................... 428/212 |
| 7,609,141 B2 | 10/2009 | Harris |
| 7,692,313 B2* | 4/2010 | Fan ............................... 257/779 |
| 7,825,491 B2* | 11/2010 | Kosowsky .................... 257/530 |
| 7,872,251 B2 | 1/2011 | Kosowsky et al. |
| 7,923,844 B2 | 4/2011 | Kosowsky |
| 8,008,767 B2* | 8/2011 | Wada et al. ................... 257/687 |
| 8,156,640 B2* | 4/2012 | Dudnikov et al. .............. 29/832 |
| 2002/0004258 A1 | 1/2002 | Nakayama et al. |
| 2002/0050912 A1 | 5/2002 | Shrier et al. |
| 2002/0061363 A1 | 5/2002 | Halas et al. |
| 2003/0010960 A1 | 1/2003 | Greuter et al. |
| 2003/0025587 A1 | 2/2003 | Whitney et al. |
| 2003/0079910 A1 | 5/2003 | Kosowsky |
| 2003/0151029 A1 | 8/2003 | Hsu |
| 2003/0218851 A1 | 11/2003 | Harris et al. |
| 2004/0000725 A1 | 1/2004 | Lee |
| 2004/0062041 A1 | 4/2004 | Cross et al. |
| 2004/0063839 A1 | 4/2004 | Kawate et al. |
| 2004/0095658 A1 | 5/2004 | Buretea et al. |
| 2004/0154828 A1 | 8/2004 | Moller et al. |
| 2004/0160300 A1 | 8/2004 | Shrier |
| 2004/0201941 A1 | 10/2004 | Harris |
| 2004/0211942 A1 | 10/2004 | Clark et al. |
| 2004/0241894 A1 | 12/2004 | Nagai et al. |
| 2004/0262583 A1 | 12/2004 | Lee |
| 2005/0026334 A1 | 2/2005 | Knall |
| 2005/0039949 A1 | 2/2005 | Kosowsky |
| 2005/0057867 A1 | 3/2005 | Harris |
| 2005/0083163 A1 | 4/2005 | Shrier |
| 2005/0106098 A1 | 5/2005 | Tsang et al. |
| 2005/0121653 A1 | 6/2005 | Chacko |
| 2005/0184387 A1 | 8/2005 | Collins et al. |
| 2005/0218380 A1 | 10/2005 | Gramespacher et al. |
| 2005/0255631 A1 | 11/2005 | Bureau et al. |
| 2005/0274455 A1 | 12/2005 | Extrand |
| 2005/0274956 A1 | 12/2005 | Bhat |
| 2005/0275070 A1 | 12/2005 | Hollingsworth |
| 2006/0060880 A1 | 3/2006 | Lee et al. |
| 2006/0142455 A1 | 6/2006 | Agarwal |
| 2006/0152334 A1 | 7/2006 | Maercklein et al. |
| 2006/0166474 A1 | 7/2006 | Vereecken et al. |
| 2006/0167139 A1 | 7/2006 | Nelson et al. |
| 2006/0181826 A1 | 8/2006 | Dudnikov, Jr. et al. |
| 2006/0181827 A1 | 8/2006 | Dudnikov, Jr. et al. |
| 2006/0193093 A1 | 8/2006 | Bertin |
| 2006/0199390 A1 | 9/2006 | Dudnikov, Jr. et al. |
| 2006/0211837 A1 | 9/2006 | Ko et al. |
| 2006/0214156 A1 | 9/2006 | Pan et al. |
| 2006/0234127 A1 | 10/2006 | Kim |
| 2006/0291127 A1 | 12/2006 | Kim et al. |
| 2007/0114640 A1 | 5/2007 | Kosowsky |
| 2007/0116976 A1 | 5/2007 | Tan et al. |
| 2007/0123625 A1 | 5/2007 | Dorade et al. |
| 2007/0139848 A1 | 6/2007 | Harris et al. |
| 2007/0146941 A1 | 6/2007 | Harris et al. |
| 2007/0208243 A1 | 9/2007 | Gabriel et al. |
| 2007/0241458 A1 | 10/2007 | Ding et al. |
| 2008/0045770 A1 | 2/2008 | Sigmund et al. |
| 2008/0047930 A1 | 2/2008 | Blanchet et al. |
| 2008/0073114 A1 | 3/2008 | Kosowsky et al. |
| 2008/0144355 A1 | 6/2008 | Boeve et al. |
| 2008/0217717 A1* | 9/2008 | Pfister et al. .................. 257/443 |
| 2008/0278873 A1 | 11/2008 | Leduc et al. |
| 2008/0295955 A1* | 12/2008 | Cawse et al. .................. 156/276 |
| 2009/0044970 A1 | 2/2009 | Kosowsky |
| 2009/0146319 A1* | 6/2009 | Onda et al. ..................... 257/782 |
| 2009/0309074 A1 | 12/2009 | Chen et al. |
| 2010/0038119 A1 | 2/2010 | Kosowsky |
| 2010/0038121 A1 | 2/2010 | Kosowsky |
| 2010/0040896 A1 | 2/2010 | Kosowsky |
| 2010/0044079 A1 | 2/2010 | Kosowsky |
| 2010/0044080 A1 | 2/2010 | Kosowsky |
| 2010/0078201 A1* | 4/2010 | Yoshizaki et al. ............ 174/255 |
| 2010/0243302 A1 | 9/2010 | Kosowsky et al. |
| 2010/0270588 A1 | 10/2010 | Kosowsky et al. |
| 2011/0061230 A1 | 3/2011 | Kosowsky |
| 2011/0062388 A1 | 3/2011 | Kosowsky et al. |

FOREIGN PATENT DOCUMENTS

| | | |
|---|---|---|
| DE | 102004049053 | 5/2005 |
| DE | 102006047377 | 4/2008 |
| EP | 0790758 A1 | 8/1997 |
| EP | 1003229 A1 | 5/2000 |
| EP | 1245586 A2 | 10/2002 |
| EP | 1542240 A2 | 6/2005 |
| EP | 1580809 A2 | 9/2005 |
| EP | 1990834 A2 | 11/2008 |
| JP | 56091464 A | 7/1981 |
| JP | 63 195275 A | 8/1988 |
| JP | 2000062076 A | 2/2000 |
| WO | WO 8906589 A1 | 7/1989 |
| WO | WO8906859 A2 | 7/1989 |
| WO | WO9602922 A2 | 2/1996 |
| WO | WO9602924 A1 | 2/1996 |
| WO | WO9726665 A1 | 7/1997 |
| WO | WO9823018 A1 | 5/1998 |
| WO | WO9924992 A1 | 5/1999 |
| WO | WO02103085 A1 | 12/2002 |
| WO | WO 2005100426 A1 | 10/2005 |
| WO | WO2006130366 A2 | 12/2006 |
| WO | WO2007062170 A2 | 5/2007 |
| WO | WO2007062171 A2 | 5/2007 |
| WO | WO2008016858 A1 | 2/2008 |
| WO | WO2008016859 A1 | 2/2008 |
| WO | WO2008153584 A1 | 12/2008 |

OTHER PUBLICATIONS

U.S. Appl. No. 12/714,358, Kosowsky, filed Feb. 26, 2010.
U.S. Appl. No. 12/703,674, Kosowsky, filed Feb. 10, 2010.
U.S. Appl. No. 12/703,701, Kosowsky, filed Feb. 10, 2010.
U.S. Appl. No. 12/703,723, Kosowsky, filed Feb. 10, 2010.
U.S. Appl. No. 12/832,022, Kosowsky, filed Jul. 7, 2010.
U.S. Appl. No. 12/833,023, Kosowsky, filed Jul. 7, 2010.
U.S. Appl. No. 12/832,040, Kosowsky, et al., filed Jul. 7, 2010.
U.S. Appl. No. 12/834,273, Kosowsky, et al., filed Jul. 12, 2010.
U.S. Appl. No. 12/834,296, Kosowsky, et al., filed Jul. 12, 2010.
Breton et al., "Mechanical properties of multiwall carbon nanotubes/epoxy composites: influence of network morphology," Carbon Elsevier UK, vol. 42, No. 5-6, pp. 1027-1030 (2004).
Celzard, A., et al., "Conduction Mechanisms in Some Graphite-polymer Composites: The Effect of a Direct-current Electric Field", Journal of Physics: Condensed Matter, 9 (1997) pp. 2225-2237.
Facchetti, Antonio, "Semiconductors for Organic Transistors", Materials Today, vol. 10, No. 3, pp. 28-37.
Granstrom et al., "laminated fabrication of polymeric photovoltaic diodes," Nature, vol. 395, pp. 257-260 (1998).
Guo et al., "Block Copolymer Modified Novolac Epoxy Resin," Polymer Physics, vol. 41, No. 17, pp. 1994-2003 (2003).
Levinson et al. "The Physics of Metal Oxide Varistors," J. App. Phys. 46 (3): 1332-1341 (1975).
Modine, F.A. and Hyatt, H.M. "New Varistor Material", Journal of Applied Physics, 64 (8), Oct. 15, 1988, pp. 4229-4232.

Onoda et al., "Photoinduced Charge Transfer of Conducting Polymer Compositions," IEICE Trans. Electronics, vol. E81-C(7), pp. 1051-1056 (1998).

Raffaelle et al., "Nanomaterial Development for Polymeric Solar Cells," IEEE 4th World Conf on Photovoltaic energy Conversion, pp. 186-189 (2006).

Reese, Colin and Bao, Zhenan, "Organic Single-Crystal Field-Effect Transistors", Materials Today, vol. 10, No. 3, pp. 20-27.

Saunders et al., "Nanoparticle-polymer photovoltaic cells," Adv. Colloid Int. Sci., vol. 138, No. 1, pp. 1-23 (2007).

Wikipedia article for "Fullerene chemistry" as originally published on Apr. 8, 2010. http://en.wikipedia.org/wiki/Fullerene_chemistry.

* cited by examiner

Processing

Processing

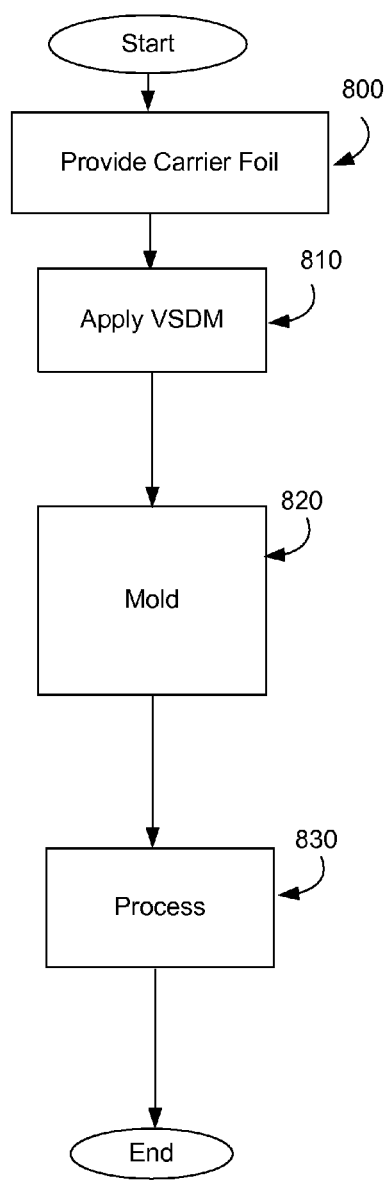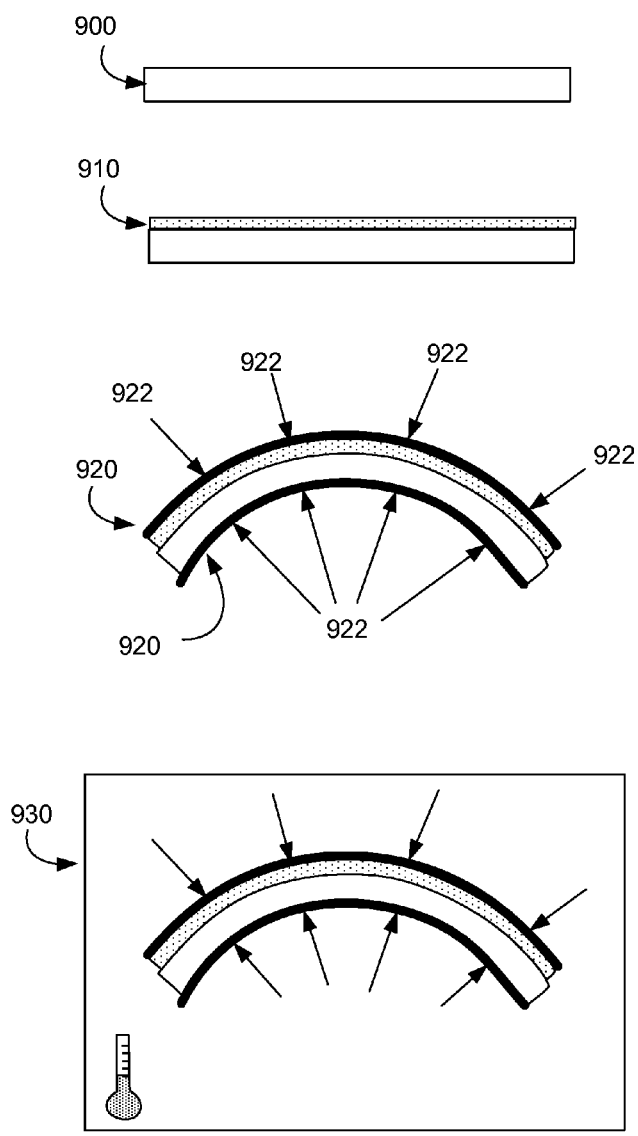
FIG. 8
FIG. 9

US 8,399,773 B2

SUBSTRATES HAVING VOLTAGE SWITCHABLE DIELECTRIC MATERIALS

CROSS REFERENCE TO RELATED APPLICATIONS

This application claims the priority benefit of U.S. provisional patent application No. 61/147,730, filed Jan. 27, 2009 and entitled "Techniques for Reducing Warpage in the Application of VSD Material to Core and Substrate," which is incorporated by reference herein.

BACKGROUND

1. Technical Field

The present invention relates to designing and fabricating objects that incorporate voltage switchable dielectric materials.

2. Description of Related Art

A printed circuit board, printed wiring board, integrated circuit (IC) package, or similar substrate (hereinafter, PCB) may be used to assemble and connect electronic components. A PCB typically includes a dielectric material and one or more conductive leads to provide electrical conductivity among various attached components, chips, and the like. In some cases, metallic leads may be included (e.g., as a layer of Cu which is subsequently etched) to provide electrical connectivity.

A typical PCB may be fabricated from reinforcements (e.g., glass fibers) that have been pre-impregnated with a matrix (e.g., a polymer resin). A matrix may be combined with (e.g. infiltrated into) the reinforcement while substantially liquid. Handling of the pre-impregnated material may be enhanced by subjecting the matrix to a partial cure (e.g., a B-stage cure) to at least partially solidify the matrix, which may at a later stage be fully cured to a C-stage. A PCB may be fabricated from one or more layers of pre-impregnated material.

A pre-impregnated material is often described as a "prepreg." Prepreg is typically available as a sheet or roll of material, and may be characterized by specifications such as grain (associated with "length" in the roll direction) and fill (associated with "width" in the roll direction). Prepreg may be characterized by various other specifications, such as dimensions (e.g., uncured thickness, cured thickness, and the like), reinforcement material (e.g., glass fibers having a diameter), weave pattern (e.g., of the fibers), matrix composition (e.g., resin composition, % matrix, fillers, and the like), curing protocols, and the like. A type of prepreg may be characterized by a "style," which may summarize one or many parameters describing the prepreg. A style may include a description of the reinforcement type (e.g., woven glass), strand size, weave configuration, density, and the like. Exemplary standard styles include 106, 1080, 2313, 2116, 7628, and the like.

PCB fabrication may include choosing one or more layers of prepreg, stacking the layers, and curing the stacked layers (often with pressure) to form a solid substrate. Vias and/or leads may be incorporated on and/or within a PCB. Prepreg often shrinks during curing, typically in a predictable fashion, and expected shrinkage may be incorporated into a PCB specification. Many prepreg materials are anisotropic, particularly with respect to dimensional changes (e.g., during curing). Dimensional changes may be different in the grain direction than in another direction (e.g., the fill direction).

Many prepreg materials are characterized with one or more specifications for "artwork compensation," which may describe an expected shrinkage during curing. Specifications for artwork compensation are often sufficiently controlled and predictable that they may be incorporated into the PCB design. The artwork compensation specification for a PCB fabricated from a stack of prepregs may often be calculated from the individual prepreg specifications, orientations, and stacking order of the prepreg layers.

A substrate, particularly a thin substrate, may be warped, bent, or otherwise deformed by various processes. In some cases, a substrate may be inadvertently deformed during processing (e.g., during curing of a PCB). A substrate may be warped by external forces. A substrate may be warped by internal elastic forces (e.g., a thermal expansion mismatch between materials).

Viewed in cross-section (i.e., viewing parallel to the plane of a PCB), a PCB may be characterized by a centerline. Typical PCB stacks are designed to be mechanically "balanced" with respect to the centerline, such that forces (e.g., induced during curing and/or cooling from high temperature) above the centerline are cancelled or otherwise opposed by equivalent forces below the centerline. For example, a prepreg layer with a first grain orientation and a first distance above the centerline may be balanced by an equivalent layer having the same grain orientation located the same distance below the centerline. Balancing is often achieved by creating a symmetrical prepreg stack with respect to the centerline. In some cases, the centerline may represent a line of mirror symmetry (at least with respect to mechanical and/or thermal properties), with layers above the centerline being balanced by corresponding "mirror" layers below the centerline.

Various electrical and electronic components may benefit from surge protection, such as protection against electrostatic discharge (ESD) and other electrical events. ESD protection may include incorporating a voltage switchable dielectric material (VSDM). A VSDM may behave as an insulator at a low voltage, and a conductor at a higher voltage. A VSDM may be characterized by a so-called "switching voltage" between these states of low and high conductivity. A VSDM may provide a shunt to ground that protects a circuit and/or component against voltages above the switching voltage by allowing currents at these voltages to pass to ground through the VSDM, rather than through the device being protected.

Many VSDM materials are polymer-based, and may include filled polymers. Processing a VSDM layer on a PCB may cause warping, which may be undesirable. Controlling dimensional changes (e.g., maintaining planarity) may improve the processing of devices incorporating a VSDM, and particularly a layer of VSDM on a thin substrate (whose dimensions may be altered by stress in the VSDM).

FIGS. 1A and 1B illustrate an exemplary unbalanced substrate (e.g., an unbalanced PCB). An unbalanced PCB 100 may be characterized by a centerline 110. A first portion 120 of the PCB (above centerline 120) may not be balanced by a corresponding second portion 130 of the PCB (below centerline 110). In some cases, imbalance may not be manifest until subsequent processing (e.g., curing the PCB and/or cooling from a curing temperature above room temperature). In the example shown in FIG. 1B, PCB 102 has been processed. In processed PCB 102, first portion 122 may have a higher shrinkage (e.g., during curing or cooling) than second portion 132, resulting in warpage of the processed PCB 102.

Voltage switchable dielectric materials may have thermal, elastic, plastic, viscous, and other properties that are different than those of typical prepreg layers. Incorporating a VSDM into a prepreg stack may result in an unbalanced substrate.

During various processing steps, imbalance in a substrate may be manifest as loss of dimensional control (e.g., warpage of a PCB).

SUMMARY OF THE INVENTION

Various aspects provide for the incorporation of a voltage switchable dielectric material into a substrate in a manner that results in the substrate meeting various specifications, including dimensionality specifications. In some embodiments, a method for designing a PCB to meet a specification may comprise choosing a first design for a PCB comprising one or more prepreg layers. A first region comprising a VSDM may be incorporated into the first design to create an ESD-protected design. A balance region may be identified, whose incorporation into the ESD-protected design is expected or predicted to balance an imbalance induced by the incorporation of the first region. The balance region may be incorporated into the ESD-protected design to create a balanced, ESD-protected design.

Some designs may be substantially planar (e.g., sufficiently planar to meet a planarity specification or perform in a desired manner). Some designs include a centerline. Certain embodiments include a prepreg stack that does not display mirror symmetry with respect to a centerline associated with the prepreg stack. Some aspects include a balanced, ESD-protected PCB (and or PCB design) that does not have mirror symmetry with respect to a centerline associated with the ESD-protected design.

A first region incorporating a VSDM may be disposed on the same side of the centerline as a balance region. The first region may be on the opposite side of the balance region. The balance region may be on the same side as the first region and opposite side of the centerline. In some cases, a balance region may be disposed a greater distance from the centerline than the first region.

Incorporating a balance region may include adding or subtracting a prepreg layer from a prepreg stack. Incorporating a balance region may include adding a first and subtracting a second prepreg layer from a prepreg stack. In some cases, a balance region comprises a plurality of separate regions. An added prepreg layer may be a different style, thickness, grain orientation, resin content, reinforcement, weave, and/or different in other ways. An added prepreg layer may be the same as another prepreg layer already in a prepreg stack.

Incorporating a balance region may include adding another material to the substrate (e.g., other than another prepreg layer). A balance region may comprise a polymer, a ceramic, a metal, and/or composites thereof. A balance region may include a filled polymer, and may include a second VSDM material. In some cases, a material incorporated into a balance region may be chosen to have similar thermal, elastic, mechanical, or other properties similar to those of the first region incorporating the VSDM.

In some cases, a PCB design may be characterized by an artwork compensation specification, which may be an integrated or averaged value of the artwork compensation specifications of the components (e.g., prepreg layers) from which the PCB is fabricated. In some cases, a balance region may include a material having a larger artwork compensation specification than that of the first design. In certain cases, a balance region may include a material having a larger artwork compensation specification than those of the individual prepreg layers. A balance region may include a material having a larger coefficient of thermal expansion (CTE) than that of the first region and/or the stackup associated with the first design. In certain cases, a balance region may include a material having a larger CTE than those of the individual prepreg layers. A balance region may include a material having a CTE that substantially matches that of the first region. A balance region may include a material having a shrinkage percentage (e.g., a strain associated with shrinkage or expansion due to curing) that substantially matches that of the first region. In some embodiments, a balance region comprises a second VSDM having similar properties and opposite location (in the stack) as compared to the VSDM in the first region.

A printed circuit board may include one or more prepreg layers, and may be characterized by a lack of mirror symmetry associated with a centerline. In some examples, an ESD-protected PCB may include a VSDM. An ESD-protected PCB may be characterized by a lack of mirror symmetry with respect to a centerline associated with the ESD-protected PCB and/or a centerline associated with the one or more prepreg layers.

An ESD-protected PCB may have one or more dimensionality specifications within an industry-defined specification (e.g., IEEE, IEC, IPC, ISO, and the like). Certain ESD-protected substrates (e.g., an ESD-protected PCB) may be characterized by a flatness within a tolerance such as an IPC (Association Connecting Electronics Industries) 4101A specification.

Certain aspects provide for molding a substrate comprising a VSDM. In exemplary embodiments, a flexible substrate such as a carrier foil (e.g., a thin polymer, metal, or composite substrate) is provided. A VSDM may be coated on at least a portion of the carrier foil. The coated carrier foil may be formed into a shape (e.g., using a mold). A mold may include planar, parallel plates. A mold may include other shapes, such as a cylinder, sphere, ellipsoid, and the like. A coated substrate may be processed (e.g., cured) while molded. In some cases, curing a coated substrate while in the mold may result in a demolded, cured, coated substrate "springing back" to a shape other than that of the mold. A cylindrically molded substrate (e.g., with the VSDM facing outward) may be cured, cooled and demolded to yield a substantially flat, coated, substrate. A cylinder used for molding may have a diameter between 0.25 and 20 inches, between 0.5 and 10 inches, between 1 and 8 inches, and between 2 and 5 inches.

BRIEF DESCRIPTION OF THE DRAWINGS

FIGS. 8 and 9 illustrate a method and associated structures, according to some embodiments.

DETAILED DESCRIPTION OF THE INVENTION

Various aspects provide for incorporating a VSDM into a substrate to create an ESD-protected substrate. In some cases, a VSDM is incorporated in a manner that results in the ESD-protected substrate meeting one or more specifications (e.g., thickness, planarity, and the like) for various subsequent processes or applications. Various aspects provide for designing a substrate (e.g., a PCB) incorporating a VSDM, and adjusting one or more aspects of the substrate to design a balanced, ESD-protected substrate. Certain embodiments include an ESD-protected substrate (e.g., incorporating a VSDM) that is mechanically and/or elastically balanced, but may not display a structural symmetry (e.g., mirror symmetry) with respect to a centerline through the substrate.

In some embodiments, a specification for a PCB is received, a VSDM is incorporated, and a balance region is incorporated into the design of the PCB to accommodate the incorporation of the VSDM while meeting the specification. Incorporating a balance region may include modifying the structure of the PCB (e.g., an order of a prepreg stackup). Incorporating a balance region may include modifying the components of the PCB (e.g., adding a polymer layer). Incorporating a balance region may include modifying the processing protocol (e.g., ramp rate, dwell time, pressure, and/or temperature associated with curing). Incorporating a balance region may include using forms, shapes, molds, and the like to mold the substrate/VSDM (or PCB) into a shape (e.g., during curing).

A VSDM may be applied as a layer to a carrier foil, which may be a polymer, a metal, a ceramic, a composite, and the like. A VSDM may be applied to a wafer, package, printed circuit board (PCB), printed wiring board (PWB), and the like. For the purposes of this specification, PCB may generally describe a substrate into which a VSDM may be incorporated.

Figure 1A:
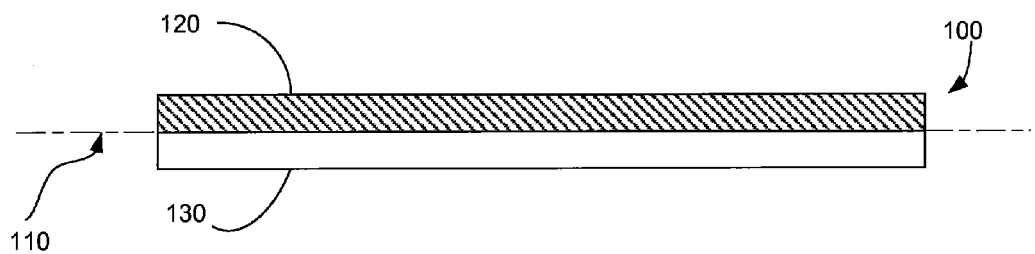
FIGS. 1A and 1B illustrate an exemplary unbalanced substrate (e.g., an unbalanced PCB).
Figure 1B:
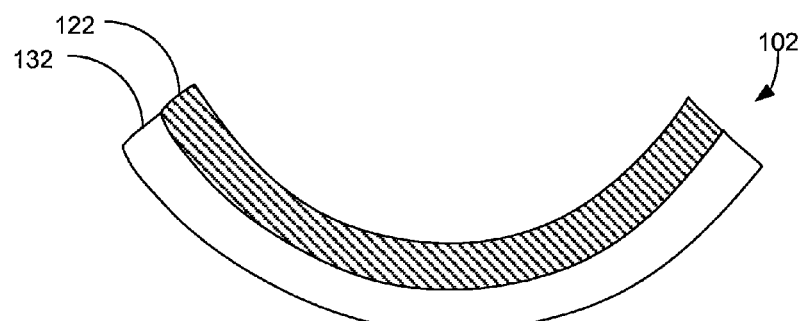
Figure 2A:
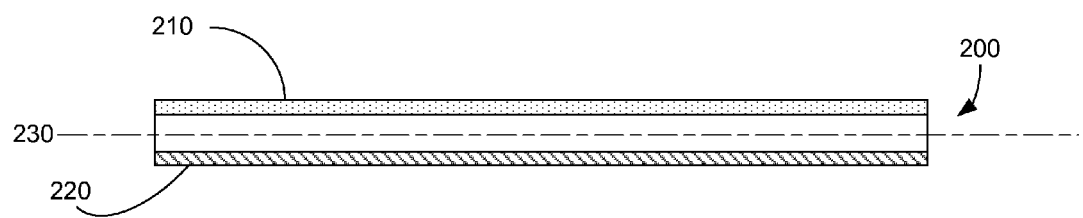
FIGS. 2A and 2B schematically illustrate a balanced substrate incorporating a VSDM, according to some embodiments.
Figure 2B:
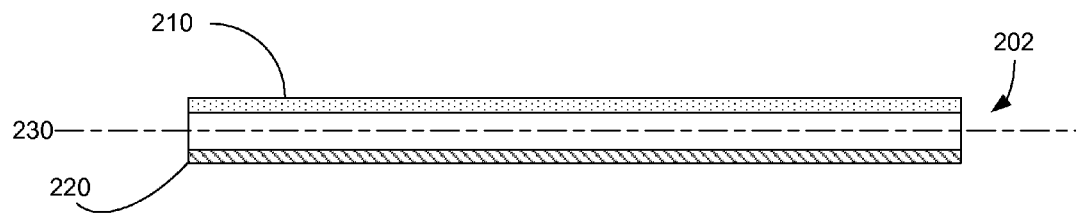

FIGS. 2A and 2B schematically illustrate a balanced substrate incorporating a VSDM, according to some embodiments. Balanced PCB 200 includes a first region 210 incorporating a VSDM. In this example, first region 210 includes a VSDM disposed as a substantially planar layer, which in some cases may be between 0.2 and 5 mils thick, or between 1 and 3 mils thick. A first region may include a VSDM disposed in other geometries (e.g., lines, traces, and other volumes).

A balance region may include a portion of the substrate whose incorporation into the design balances one or more forces induced or associated with the VSDM (e.g., during subsequent processing). A balance region may include one or more additional layers of prepreg. A balance region may include another material (e.g., a polymer, a filled polymer, a VSDM, a resin layer, a reinforcement layer, and the like). A balance region may be characterized by the removal of a layer from the design. A balance region may be planar, and may include shapes other than planer.

In some embodiments, a balance region may be associated with a PCB stackup. Many typical PCB stackups (not incorporating a VSDM) are balanced. A PCB stackup incorporating a balance region may appear "imbalanced" with respect to a centerline, particularly when the inclusion of the VSDM is not accounted for (i.e., the PCB stack, ex-VSDM, may appear unbalanced). Concomitant incorporation of a first region comprising a VSDM and a balance region may result in a balanced PCB design, notwithstanding an apparent imbalance in the PCB stack ex-VSDM. Balanced PCB 200 may include a balance region 220.

In the example shown in FIGS. 2A and 2B, first region 210 may include a VSDM having a larger coefficient of thermal expansion (CTE) than that of other portions of the substrate other than balance region 220. Balance region 220 may have a similar (or the same) CTE as that of first region 210. In this example, first region 210 is disposed above centerline 230, and balance region 220 is disposed below (on the other side of) centerline 230. When first region 210 and balance region 220 have the same CTE, they may be disposed the same distance from centerline 230. When balance region 220 has a smaller CTE than that of first region 210, it may be disposed farther from centerline 230 (and vice versa).

FIG. 2B is a schematic illustration of a processed PCB. In this example, PCB 200 may be processed to form processed PCB 202. Processing may include heating, exposing to light, depositing, etching, ashing, pressing, curing, cutting, engraving, drilling, plating, soldering re-flowing, and the like. Processing may include attaching one or more components, such as resistors, capacitors, inductors, and the like. Processing may include attaching a chip, a package, a system-in-package (SIP), system-on-chip (SOC), and the like.

Figure 3A:
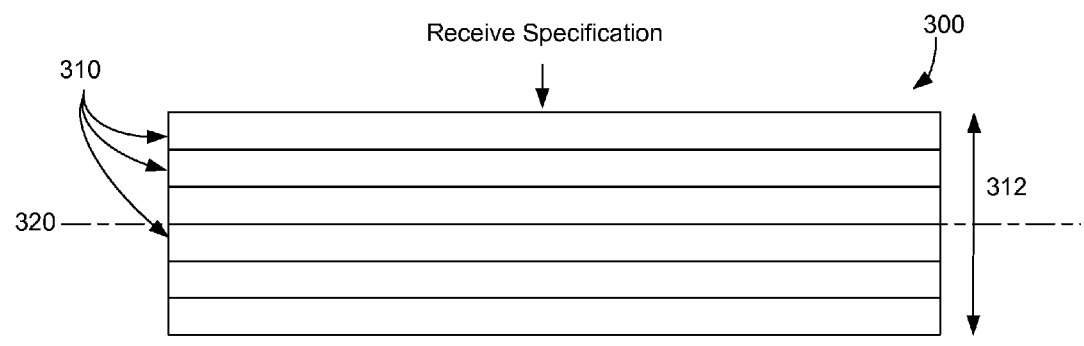
FIGS. 3A, 3B, and 3C illustrate steps and structures associated with designing balanced, ESD-protected substrates, according to some embodiments.
Figure 3B:
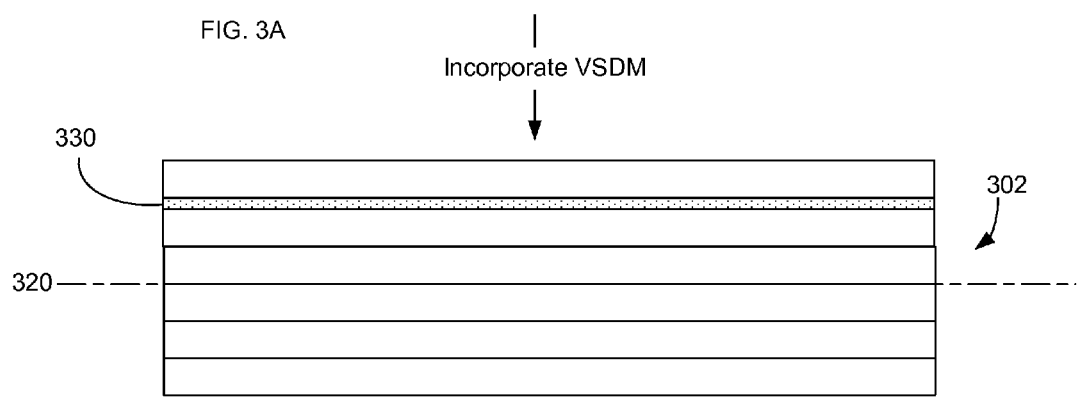
Figure 3C:
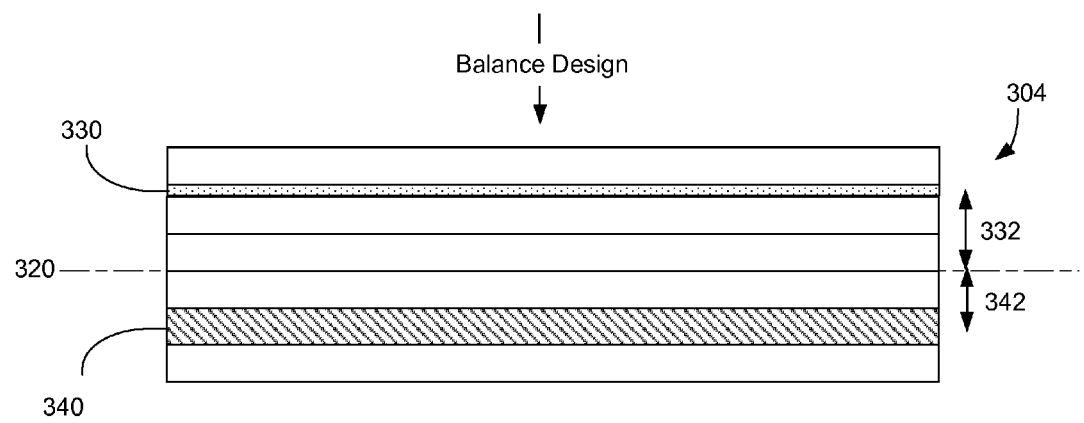

Processed PCB 202 may meet one or more specifications, such as thickness, flatness, size, thermal properties, dielectric properties, and the like. Some specifications may be standardized, (e.g., by a standards-setting organization), such as ISO, IEEE, IEC, IPC, JEDEC and the like. In some embodiments, a substrate (which may incorporate a VSDM layer) may meet a flatness standard, such as IPC-4101A FIGS. 3A, 3B, and 3C illustrate steps and structures associated with designing balanced, ESD-protected substrates, according to some embodiments. A substrate designed for an application may be defined by one or more specifications. In this example, a first substrate design 300 may be a PCB, and may include one or more prepreg layers 310. In some cases, a prepreg stackup may be specified, which may result in a design that includes a centerline 320. In some cases, external properties (e.g., a desired thickness 312) may be specified.

FIG. 3B schematically illustrates a design (that may be unbalanced) for an ESD-protected substrate. ESD-protected substrate design 302 includes a first region 330 that includes a VSDM. A VSDM may (inter alia) protect various circuits attached to the substrate. Protection may include protection against spurious electrical events, such as electrostatic discharge (ESD). For the purposes of this specification, a substrate incorporating a VSDM may be described as an ESD-protected substrate.

FIG. 3C illustrates a balanced, ESD-protected substrate design. In this example, a balanced ESD-protected substrate design 304 includes a first region 330 having a VSDM and a balance region 340. Balance region 340 may "balance" or otherwise counteract various undesirable effects associated with the incorporation of first region 330. Representative, non-limiting effects may include warpage induced by curing the VSDM, dimensional changes associated with CTE mismatch between the first region and other portions of the substrate, and the like. Balanced, ESD-protected substrate design 304 may not display mirror symmetry with respect to centerline 320.

A design may be modified to incorporate a balance region by calculating or otherwise estimating the effects of incorporation of the first region (e.g., the VSDM) on subsequent processing steps. For example, a shrinkage associated with curing of a VSDM may be measured on a test coupon. For a given thickness of VSDM (incorporated into a PCB design), VSDM properties, and associated process of the other materials in the PCB (e.g., prepreg), an expected effect may be calculated (e.g., using a rule of mixtures law and associated geometrical factors). In the example shown in FIG. 3C, the effect of incorporating a first region 330 (e.g., having a first curing shrinkage or first CTE) located a first distance 332 from centerline 320, may be calculated using the stackup geometry and associated properties of the stackup materials.

Using computer simulation of one or more possible modifications to the unbalanced design, a type of layer having an appropriate combination of balance region parameters may be chosen that results in a balanced ESD-protected design. For example, designs having layers of different CTE values, thicknesses, distances 342, curing shrinkages, and the like may be simulated (e.g., using Finite Element Modeling of the design to predict properties), and a combination resulting in a balanced ESD-protected substrate may be selected. In some cases, a large number of pseudorandomly selected designs may be simulated (e.g., using Monte-Carlo simulation) and those resulting in the best match to desired properties may be selected.

In an exemplary calculation, a first design may include a first prepreg stackup. A planar first region incorporating a VSDM may be incorporated into the design. In some cases, a thickness, location, switching voltage, shape, and other properties of the first region may be at least partially determined by desired electrical properties (e.g., location of vias, lines, chips, and the like). An expected result of the incorporation may be calculated based on properties of the first region and properties of the prepreg stackup. Exemplary expected results include an expected warpage associated with curing the VSDM or expected warpage associated with cooling of a cured substrate from a higher temperature to room temperature. A balance region may be identified by simulating the addition, subtraction, (and/or both) of additional prepreg layers (and the corresponding effect on final properties). A "goodness of fit" parameter may be maximized such that a simulation is chosen that is most likely to result in desired properties. For example, a plurality of randomly selected additions/subtractions of prepreg layers may be simulated, and those that are most expected to result in a flat substrate after curing and cooling may be chosen. In some embodiments, desired properties (e.g., elastic moduli, curing shrinkage, CTE, thickness, location) of a balance region may be solved for analytically, and an appropriate material having such properties may be chosen and designed into the appropriate location or locations.

Figure 4A:
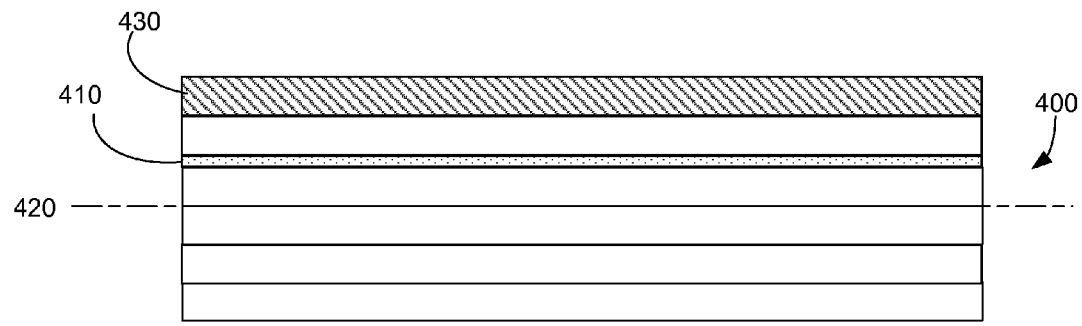
FIGS. 4A, 4B, and 4C schematically illustrate several different balance regions, according to some embodiments.
Figure 4B:
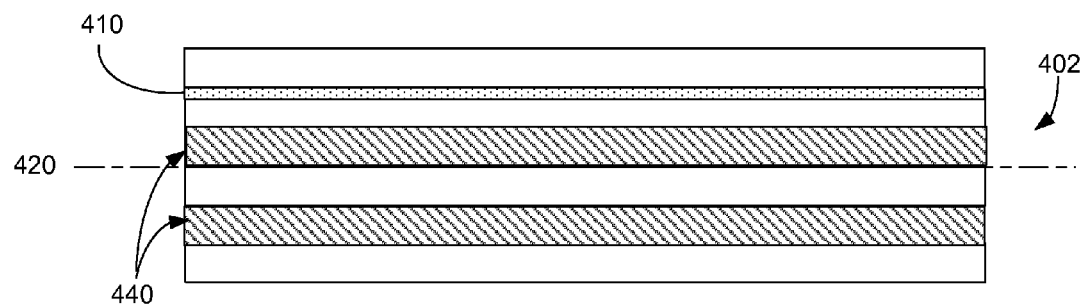
Figure 4C:
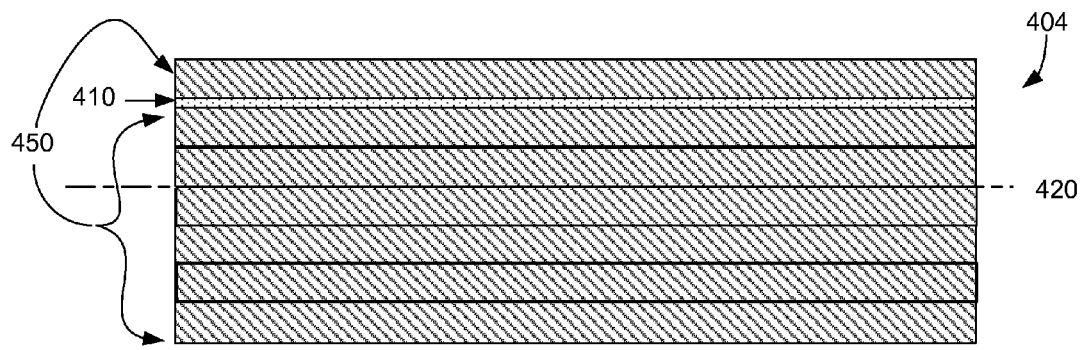

FIGS. 4A, 4B, and 4C schematically illustrate several different balance regions, according to some embodiments. FIG. 4A illustrates a balanced, ESD-protected design for a PCB 400. PCB 400 includes a first region 410 having a VSDM, located on a first side of a centerline 420. A balance region 430 may be at least partially disposed on the same side of the centerline as first region 410. Exemplary balance region 430 may be characterized by a curing shrinkage lower than that of various prepreg layers. Exemplary balance region 430 may have a higher, lower, or similar elastic modulus than that of various prepreg layers.

FIG. 4B illustrates a balanced, ESD-protected design for a PCB 402. PCB 402 includes a first region 410, having a VSDM, located on a first side of a centerline 420. In this example, balance region 440 is partially disposed on an opposite side of the centerline and partially disposed on the same side of the centerline as first region 410.

FIG. 4C illustrates a balanced, ESD-protected design for a PCB 404. PCB 404 includes a first region 410, having a VSDM, located on a first side of a centerline 420. In this example, substantially the entire PCB stackup has been redesigned (e.g., replaced with different prepreg layers) to balance the incorporation of first region 410. Balanced, ESD-protected substrates 400, 402, and 404 may not display mirror symmetry with respect to centerline 420.

Figure 5:
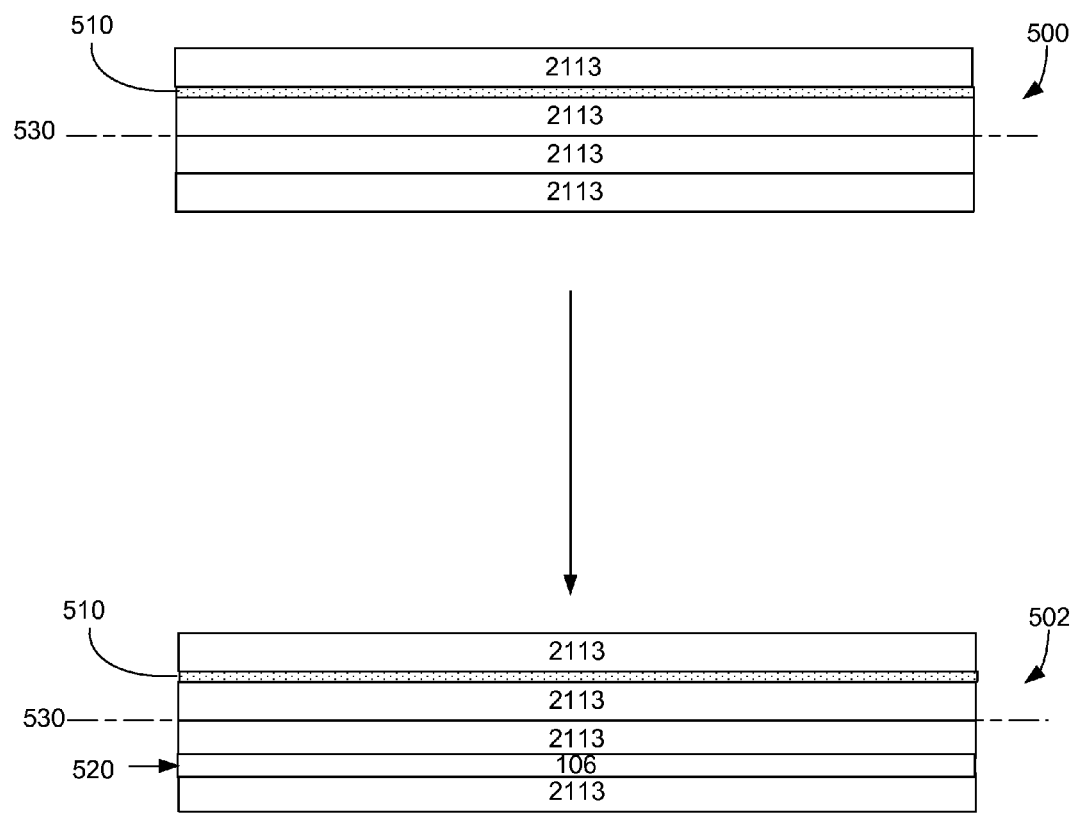
FIG. 5 illustrates an incorporation of a balance region into a PCB design, according to some embodiments.

FIG. 5 illustrates an incorporation of a balance region into a PCB design, according to some embodiments. FIG. 5 illustrates an exemplary incorporation that includes adding a prepreg layer. In this example an ESD-protected substrate 500 may include a first region 510 having a VSDM. In this example, the substrate includes a stack of four style-2113 prepreg layers, with the first region disposed as shown. ESD-protected substrate 500 may be unbalanced.

The design for ESD-protected substrate 500 may be modified to create a design for a balanced, ESD-protected substrate 502. In this example, balanced ESD-protected substrate 502 includes a balance region comprising an additional layer 520 of style 106 prepreg, inserted on the opposite side of the centerline (with respect to first region 510). In this example, additional layer 520 is inserted between the two layers of style 2113 prepreg, opposite the first region 510.

Certain embodiments include adjusting a type associated with a balance region (e.g., a type of prepreg layer). A type may be a multivariable descriptor of one or more (and in some cases, many) characteristics of a material such as a prepreg layer. Type may include a style and/or other parameters characterizing a layer, such as reinforcement (e.g., E-glass), resin type (e.g., epoxy), additional resins (e.g., multistage resins), halogen concentration, curative type, resin content, catalyst, resin filler type and loading, Tg, CTE, permittivity, loss, dielectric constant, modulus, and the like. In some cases, a type may include a standard characteristic (e.g., a style) modified and annotated to further define characteristics (e.g., a halogen-free, two-stage resin of style 106 having a high Tg). Choosing a type may include choosing appropriate prepreg parameters (e.g., resin composition, resin content, filler composition, filler content, curing kinetics, and the like).

Balanced ESD-protected PCB 502 may not display mirror symmetry with respect to the centerline 530, which may be located at a mid-point of the substrate (including the first region 510) or a mid-point of the PCB-stack (not including the first region 510). In some embodiments, the removal of one or more layers of prepreg, to rebalance an imbalanced PCB, may be described as the incorporation of a balance region.

Figure 6:
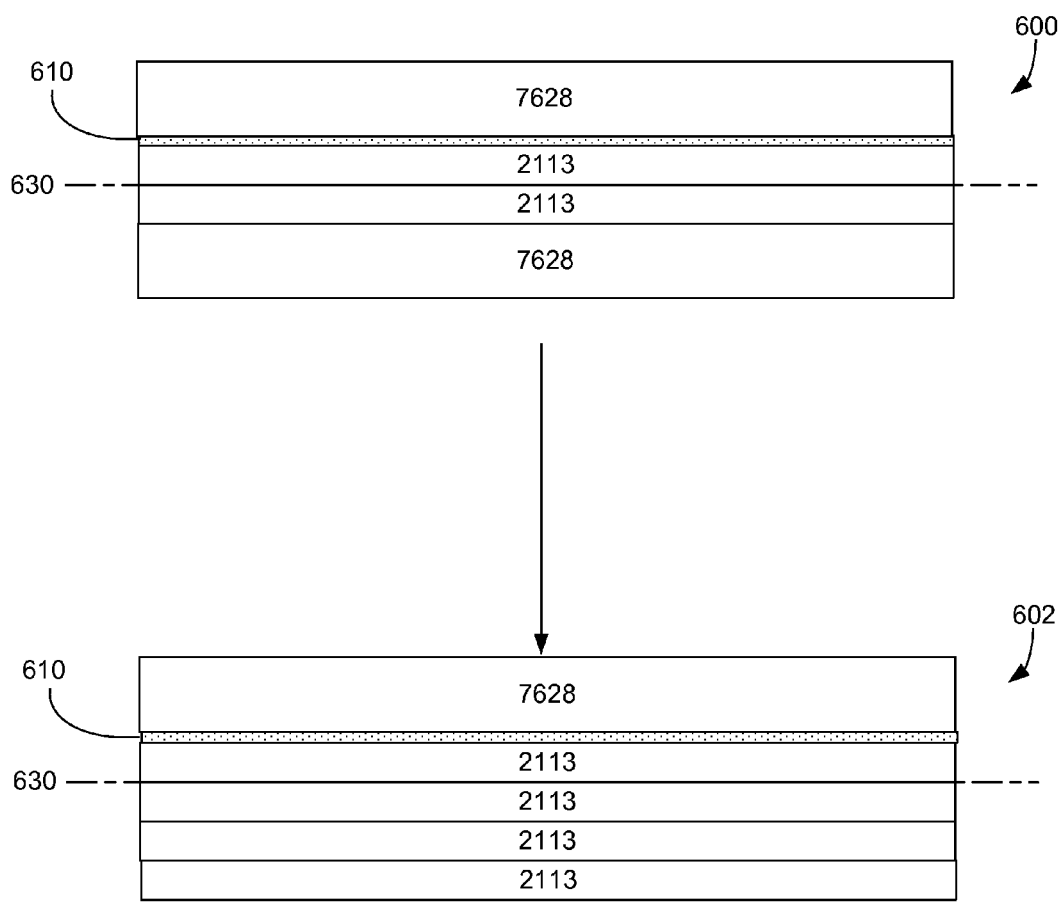
FIG. 6 illustrates an incorporation of a balance region into a PCB design, according to some embodiments.

FIG. 6 illustrates an incorporation of a balance region into a PCB design, according to some embodiments. In this exemplary incorporation, a first prepreg layer is removed and a second prepreg layer is added to a design. ESD-protected PCB 600 includes a first region 610 comprising a VSDM. Excluding the first region 610, the design includes four prepreg layers, layered in styles 7628-2113-centerline-2113-7628. First layer 610 is disposed between the upper 7628 and 2113 prepreg layers. The design for ESD-protected PCB 600 may be unbalanced.

Balanced ESD-protected PCB 602 includes a different prepreg stacking than that of ESD-protected PCB 600. An aspect of this difference may be described as a difference in prepreg layers on the opposite side of first region 610. In this example, the opposite layer of style 7628 prepreg has been swapped for two layers of style 2113 prepreg, resulting in a balanced, ESD-protected PCB. Balanced ESD-protected PCB 602 may not display mirror symmetry with respect to the centerline 630, which may be located at a mid-point of the substrate (including the first region 610) or a mid-point of the PCB-stack (not including the first region 610).

Figure 7:
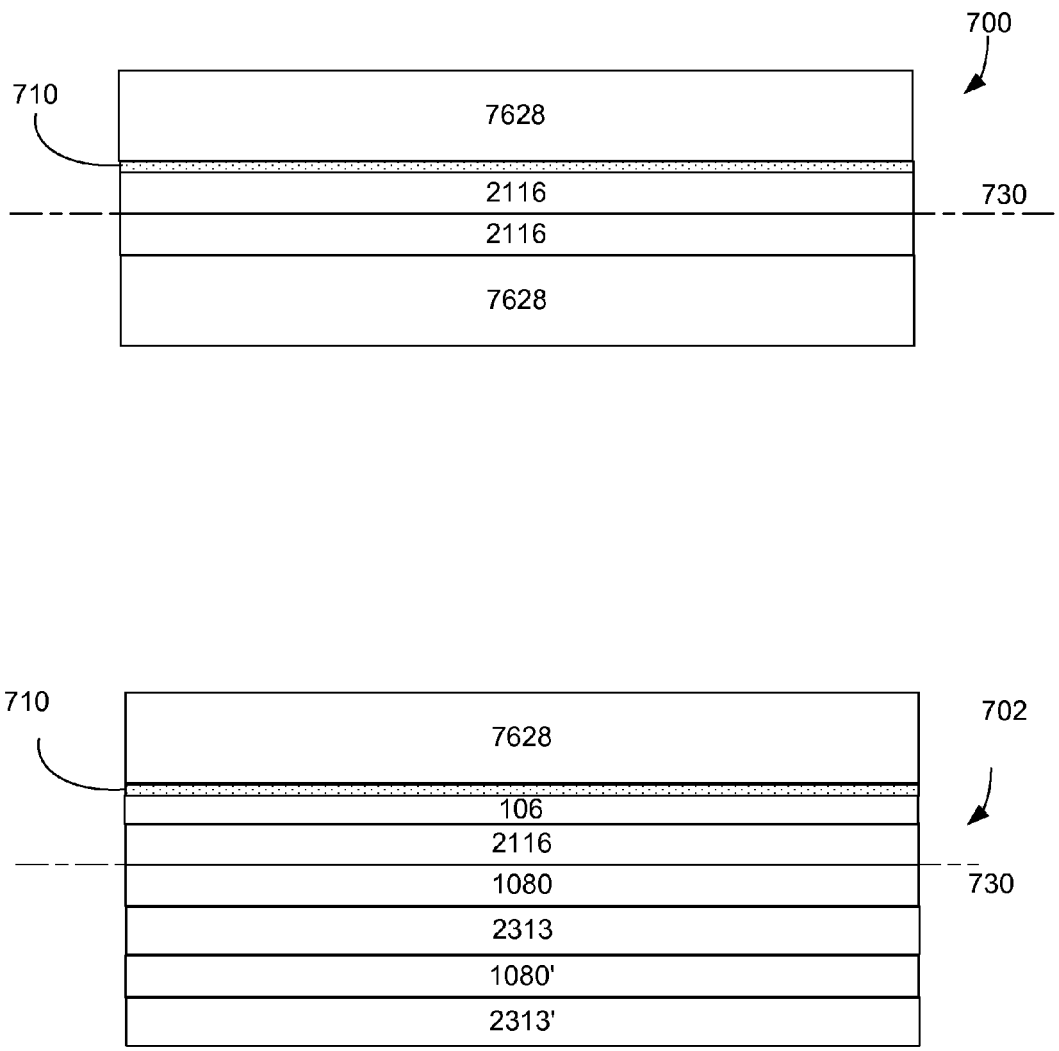
FIG. 7 illustrates an incorporation of a balance region into a PCB design, according to some embodiments.

FIG. 7 illustrates an incorporation of a balance region into a PCB design, according to some embodiments. ESD-protected PCB 700 includes a first region 710 comprising a VSDM. Excluding the first region 710, the design includes four prepreg layers, layered in styles 7628-2116-centerline-2116-7628. First layer 710 is disposed between the upper 7628 and 2116 prepreg layers. The design for ESD-protected PCB 700 may be unbalanced.

Balanced ESD-protected PCB 702 includes a different prepreg stacking than that of ESD-protected PCB 700. Differences include an addition of a prepreg layer on the same side as first region 710, a swapping of prepreg layers on the opposite side of the centerline, and a change in grain orientation of prepreg layers.

In this example, an additional prepreg layer style 106 is added between first region 710 and adjacent prepreg layer style 2116. On the opposite side of the centerline, the styles 2116 and 7628 prepreg layers have been replaced with styles 1080, 2313, 1080', and 2313' in a stacking as shown. In this example, styles 1080 and 1080' have different grain orientations, and styles 2313 and 2313' have different grain orientations. Balanced ESD-protected PCB 702 may not display mirror symmetry with respect to the centerline 730, which may be located at a mid-point of the substrate (including the first region 710) or a mid-point of the PCB-stack (not including the first region 710).

FIGS. 8 and 9 illustrate a method and associated structures, according to some embodiments. FIG. 8 illustrates a method for processing a substrate comprising a VSDM. FIG. 9 illustrates exemplary associated structures.

A carrier foil 900 is provided in step 800. In step 810, a VSDM 910 may be applied to (e.g., coated on) at least a portion of the carrier foil 900. In step 820, the coated carrier foil may be shaped or formed using a mold 920. In some embodiments, an optional drying step may be performed on the coated carrier foil to dry and/or partially cure the VSDM. Molding may include the use of pressure 922. Pressure may be applied via an external component (e.g., mold 920). Pressure may be applied via internally-generated elastic forces. For example, a coated carrier foil may be wrapped around a cylinder. For situations in which the carrier foil has a much higher elastic modulus than that of the VSDM, the VSDM may be constrained to (and sheared by) the shape and size of the carrier foil. A mold may be any shape, including flat (e.g., planar, parallel plates), cylindrical, spherical, hyperbolic, ellipsoidal, parabolic, angled, and other shapes.

In step 830, the coated carrier foil is processed. In some cases, processing may include heating the coated carrier foil to a temperature, which may be performed in an oven 930. In some cases, pressure 922 may be maintained during processing. Processing may include curing, drying, post-cure treatments, exposure to light (e.g, ultraviolet light), vibration, ultrasonication, application of pressure or other forces, bending, stretching, clamping, and the like. In some embodiments, a coated carrier foil may be wrapped around a cylinder (e.g., with the VSDM facing outward), and the wrapped cylinder may be placed in an oven and heated to a curing temperature associated with the VSDM. A residual contraction of the cured VSDM/carrier foil composite (e.g., upon cooling and demolding) may yield a substantially planar carrier foil having a cured VSDM layer thereon.

Some embodiments include adjusting a formulation of a VSDM, which may include changing an epoxy (e.g., type, ratio), curative agent (e.g., type, ratio to epoxy or resin), and/or the addition of other additives to improve balance. Exemplary epoxies include Epon 828, GP611, Polybd, and the like. Exemplary curative agents include Dicyandiamide, Diaminodiphenylsulfone, Nadic methyl anhydrides, and the like.

A first region having a VSDM may consist of the VSDM. A first region may comprise a VSDM and another substance (or gaps, holes, and the like). A first region may be uniform (e.g., planar). A first region may include discrete elements (e.g., disks, lines, wires, and the like).

Some embodiments include sensors to sense various parameters (e.g., thickness, strain, temperature, stress, viscosity, concentration, depth, length, width, thickness, number of layers, coefficient of thermal expansion (CTE), switching voltage and/or voltage density (between insulating and conducting), trigger voltage, clamp voltage, off-state current passage, dielectric constant, time, date, and other characteristics). Various apparatus may monitor various sensors, and systems may be actuated by automated controls (solenoid, pneumatic, piezoelectric, and the like). Some embodiments include a computer readable storage medium coupled to a processor and memory. Executable instructions stored on the computer readable storage medium may be executed by the processor to perform various methods described herein. Sensors and actuators may be coupled to the processor, providing input and receiving instructions associated with various methods. Certain instructions provide for closed-loop control of various parameters via coupled sensors providing input and coupled actuators receiving instructions to adjust parameters. Certain embodiments include materials. Various embodiments include telephones (e.g., cell phones), USB-devices (e.g., a USB-storage device), personal digital assistants, laptop computers, netbook computers, tablet PC computers and the like.

The above description is illustrative and not restrictive. Many variations of the invention will become apparent to those of skill in the art upon review of this disclosure. The scope of the invention should, therefore, be determined not with reference to the above description, but instead should be determined with reference to the appended claims along with their full scope of equivalents.

What is claimed is:

1. A printed circuit board having:
one or more prepreg layers;
a first region including a voltage switchable dielectric material; and
a flatness within one or more IPC standards for flatness; a balance region that offsets an imbalance in the printed circuit board associated with the first region.

2. The printed circuit board of claim 1, wherein at least one standard includes a specification associated with IPC-4101A.

3. The printed circuit board of claim 1, wherein a stacking of the prepreg layers is not characterized by mirror symmetry with respect to a centerline associated with the stacking of the prepreg layers.

4. The printed circuit board of claim 1, wherein a stacking of the prepreg layers is not characterized by mirror symmetry with respect to a centerline associated with the printed circuit board.

5. The printed circuit board of claim 1, wherein any of the first region and balance region is substantially planar.

6. The printed circuit board of claim 1, wherein the first region and at least a portion of the balance region are on opposite sides of a centerline of the printed circuit board.

7. The printed circuit board of claim 6, wherein the first region and the portion of the balance region are the same distance from the centerline.

8. The printed circuit board of claim 6, wherein the portion of the balance region is a greater distance from the centerline than the first region.

9. The printed circuit board of claim 1, wherein the first region and at least a portion of the balance region are on the same side of a centerline.

10. The printed circuit board of claim 1, wherein at least a portion of the balance region is a smaller or larger distance from a centerline than the first region.

11. The printed circuit board of claim 1, wherein the first region is characterized by a first thermal expansion coefficient, and the balance region is characterized by a second thermal expansion coefficient.

12. The printed circuit board of claim 1, wherein the balance region includes at least one prepreg layer.

13. The printed circuit board of claim 12, wherein first and second prepreg layers are on the same side of a centerline.

14. The printed circuit board of claim 12, wherein first and second prepreg layers are on opposite sides of a centerline.

15. The printed circuit board of claim 12, wherein a first prepreg layer has a higher resin content than a second prepreg layer.

16. The printed circuit board of claim 12, wherein a first prepreg layer has a larger artwork compensation specification than that of a second prepreg layer.

17. The printed circuit board of claim 12, wherein each of a first and a second prepreg layer is characterized by an artwork compensation specification, and a difference between the artwork compensation specifications is greater than 0.0001 inches per inch of length in a grain direction associated with the respective prepreg layers.

18. The printed circuit board of claim 12, wherein a first prepreg layer has a smaller diameter reinforcement than that of a second prepreg layer.

19. The printed circuit board of claim 12, wherein at least a portion of a reinforcement associated with a first prepreg layer is of a different composition, size, or weave than that associated with a second prepreg layer.

20. The printed circuit board of claim 12, wherein at least one prepreg layer includes a style 106 prepreg layer.

21. The printed circuit board of claim 12, wherein first and second prepreg layers have different thicknesses.

22. The printed circuit board of claim 12, wherein first and second prepreg layers have different basis weights.

23. The printed circuit board of claim 12, wherein the balance region includes a polymer.

24. The printed circuit board of claim 23, wherein the polymer includes a filled polymer.

25. The printed circuit board of claim 24, wherein the filled polymer includes a second voltage switchable dielectric material.

* * * * *